(12) United States Patent
Esteve et al.

(10) Patent No.: US 9,577,073 B2
(45) Date of Patent: Feb. 21, 2017

(54) METHOD OF FORMING A SILICON-CARBIDE DEVICE WITH A SHIELDED GATE

(71) Applicant: Infineon Technologies AG, Neubiberg (DE)

(72) Inventors: Romain Esteve, Treffen am Ossiacher (AT); Dethard Peters, Hoechstadt (DE); Wolfgang Bergner, Klagenfurt (AT); Ralf Siemieniec, Villach (AT); Thomas Aichinger, Villach (AT); Daniel Kueck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/567,504

(22) Filed: Dec. 11, 2014

(65) Prior Publication Data
US 2016/0172468 A1     Jun. 16, 2016

(51) Int. Cl.
*H01L 21/336*     (2006.01)
*H01L 29/66*     (2006.01)
(Continued)

(52) U.S. Cl.
CPC ... *H01L 29/66734* (2013.01); *H01L 21/02236* (2013.01); *H01L 21/045* (2013.01);
(Continued)

(58) Field of Classification Search
CPC ........... H01L 29/66734; H01L 29/4236; H01L 29/1608
See application file for complete search history.

(56) References Cited

U.S. PATENT DOCUMENTS 7,582,922 B2    9/2009  Werner
7,700,971 B2    4/2010  Ueno
(Continued)

FOREIGN PATENT DOCUMENTS

DE    102012211221 A1    1/2013
JP    2001358338 A      12/2001
(Continued)

OTHER PUBLICATIONS

Cree, Inc. "Silicon Carbide Power MOSFET", "CMF20120D Rev. D", 1-8.
(Continued)

*Primary Examiner* — Reema Patel
*Assistant Examiner* — Syed Gheyas
(74) *Attorney, Agent, or Firm* — Murphy, Bilak & Homiller, PLLC

(57) ABSTRACT

A silicon-carbide semiconductor substrate having a plurality of first doped regions being laterally spaced apart from one another and beneath a main surface, and a second doped region extending from the main surface to a third doped region that is above the first doped regions is formed. Fourth doped regions extending from the main surface to the first doped regions are formed. A gate trench having a bottom that is arranged over a portion of one of the first doped regions is formed. A high-temperature step is applied to the substrate so as to realign silicon-carbide atoms along sidewalls of the trench and form rounded corners in the gate trench. A surface layer that forms along the sidewalls of the gate trench during the high-temperature step from the substrate is removed.

18 Claims, 17 Drawing Sheets

(51) Int. Cl.
  *H01L 29/423* (2006.01)
  *H01L 21/324* (2006.01)
  *H01L 21/04* (2006.01)
  *H01L 21/02* (2006.01)
  *H01L 21/311* (2006.01)
  *H01L 29/16* (2006.01)

(52) U.S. Cl.
  CPC ........ *H01L 21/049* (2013.01); *H01L 21/0465* (2013.01); *H01L 21/0475* (2013.01); *H01L 21/31111* (2013.01); *H01L 21/324* (2013.01); *H01L 21/3247* (2013.01); *H01L 29/4236* (2013.01); *H01L 29/66068* (2013.01); *H01L 29/1608* (2013.01)

(56) References Cited

U.S. PATENT DOCUMENTS

| | | | |
|---|---|---|---|
| 7,989,882 B2 | 8/2011 | Zhang et al. | |
| 8,525,254 B2 | 9/2013 | Treu et al. | |
| 8,637,922 B1 | 1/2014 | Siemieniec et al. | |
| 2006/0289929 A1* | 12/2006 | Andrews | H01L 29/66734 257/330 |
| 2010/0207205 A1* | 8/2010 | Grebs | H01L 23/544 257/334 |
| 2013/0001592 A1* | 1/2013 | Miyahara | H01L 29/4236 257/77 |
| 2014/0145206 A1* | 5/2014 | Siemieniec | H01L 29/66068 257/77 |

FOREIGN PATENT DOCUMENTS

| | | |
|---|---|---|
| JP | 2006196523 A | 7/2006 |
| JP | 2009088187 A | 4/2009 |
| JP | 2014139956 A | 7/2014 |
| WO | 2013076890 A1 | 5/2013 |
| WO | 2014103257 A1 | 7/2014 |

OTHER PUBLICATIONS

Siemieniec, et al., "Semiconductor Device", U.S. Appl. No. 13/685,283, filed Nov. 26, 2012.

Yano, et al., "Increased Channel Mobility in 4H-SiC UMOSFETs Using On-axis Substrates", "Materials Science Forum", vols. 556-557 (2007), pp. 807-810.

* cited by examiner

US 9,577,073 B2

METHOD OF FORMING A SILICON-CARBIDE DEVICE WITH A SHIELDED GATE

TECHNICAL FIELD

The instant application generally relates the formation of devices in silicon-carbide substrates and more particularly relates to techniques for forming a silicon-carbide based switching device with an electrically shielded gate structure.

BACKGROUND

Semiconductor transistors, in particular field-effect controlled switching devices such as Metal Oxide Semiconductor Field Effect Transistors (MOSFET) and Insulated Gate Bipolar Transistors (IGBT) have been used in a wide variety of applications such as power supplies, power converters, electric cars and air-conditioners. Many of these applications are high power applications, which require the transistors to be able to accommodate substantial current and/or voltage.

Power transistors, which may have voltage blocking capabilities of up to several hundred volts and a current rating of higher than one ampere, can be implemented as vertical MOS trench transistors. In a vertical transistor, a gate electrode can be arranged in a trench that extends in a vertical direction of the semiconductor body. The gate electrode is dielectrically insulated from source, body and drift regions of the transistor and is adjacent to the body region in a lateral direction of the semiconductor body. A drain region may adjoin the drift region, and a source electrode may be connected to the source region.

Silicon-carbide (SiC) offers certain favorable properties as a substrate material for power transistors. The specific properties of SiC can be utilized to implement power transistors with a higher voltage blocking capability at a given on-resistance in comparison to semiconductor devices using other substrate materials, such as silicon. For example, SiC offers a critical electric field (i.e., the electric field at which avalanche breakdown occurs) of $2\times10^6$ Volts/Centimeter (V/cm), which is higher than that of conventional silicon. Thus, a comparably configured SiC based transistor has a higher threshold for avalanche breakdown than a conventional silicon based transistor.

Although SiC offers favorable properties with respect to breakdown voltage, it also presents several design challenges. For example, in an SiC based device, the interface between the SiC and the gate dielectric (e.g., $SiO_2$) is prone to thermal oxidation, which leads to defects in the SiC. One consequence of these defects is lower electron mobility and increased on-resistance. Furthermore, due to difficulties in trench etching techniques, the corners of the gate trench in an SiC based device are uneven. Consequently, it is difficult to provide a gate dielectric of uniform thickness in the corners of the gate trench. This in turn leads to increased electric fields in the corners of the gate trench, which make the device more susceptible to failure. The electric field in the gate dielectric may increase by a factor 2.5 if the electric field in the SiC approaches the critical electric field. Thus, to fully take advantage of the beneficial avalanche breakdown properties of SiC, proper measures must be taken to shield the gate dielectric from the large voltages that are tolerated by the SiC material.

There is a need to provide a power transistor in SiC technology with minimal defects in the channel region and a shielded gate structure at minimal expense.

SUMMARY

A method of forming a semiconductor device is disclosed. According to an embodiment, the method includes forming a silicon-carbide semiconductor substrate having a plurality of first doped regions being laterally spaced apart from one another and beneath a main surface of the substrate, a second doped region extending from the main surface to a third doped region that is above the first doped regions, and a plurality of fourth doped regions in the substrate extending from the main surface to the first doped regions. The second region has a first conductivity type, and the first, third and fourth doped regions have a second conductivity type. The substrate is annealed substrate so as to activate dopant atoms in the second, third and fourth doped regions. A gate trench that extends through the second and third doped regions and has a bottom that is arranged over a portion of one of the first doped regions is formed. A high-temperature step is applied to the substrate in a non-oxide and non-nitride forming atmosphere so as to realign silicon-carbide atoms along sidewalls of the gate trench and to form rounded corners between the bottom and sidewalls of the gate trench. A surface layer that forms along the sidewalls of the gate trench during the high-temperature step is removed from the substrate.

A method of forming a semiconductor device from a first conductivity type silicon-carbide semiconductor substrate having a main surface is disclosed. According to an embodiment, the method includes forming a plurality of buried second conductivity type regions beneath the main surface and laterally spaced apart from one another. A first conductivity type source region and a second conductivity type body region are formed in the substrate. Second conductivity type contact regions extending from the main surface to the buried second conductivity type regions are formed in the substrate. The substrate is annealed so as to activate dopant atoms in the source, body and contact regions. A gate trench that extends through the source and body regions and has a bottom that is arranged over a portion the buried regions is formed. A high-temperature step is applied to the substrate in a non-oxide and non-nitride forming atmosphere so as to realign silicon-carbide atoms along sidewalls of the gate trench and to form rounded corners between the bottom and sidewalls of the gate trench. A surface layer that forms along the sidewalls of the gate trench during the high-temperature step is removed from the substrate.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
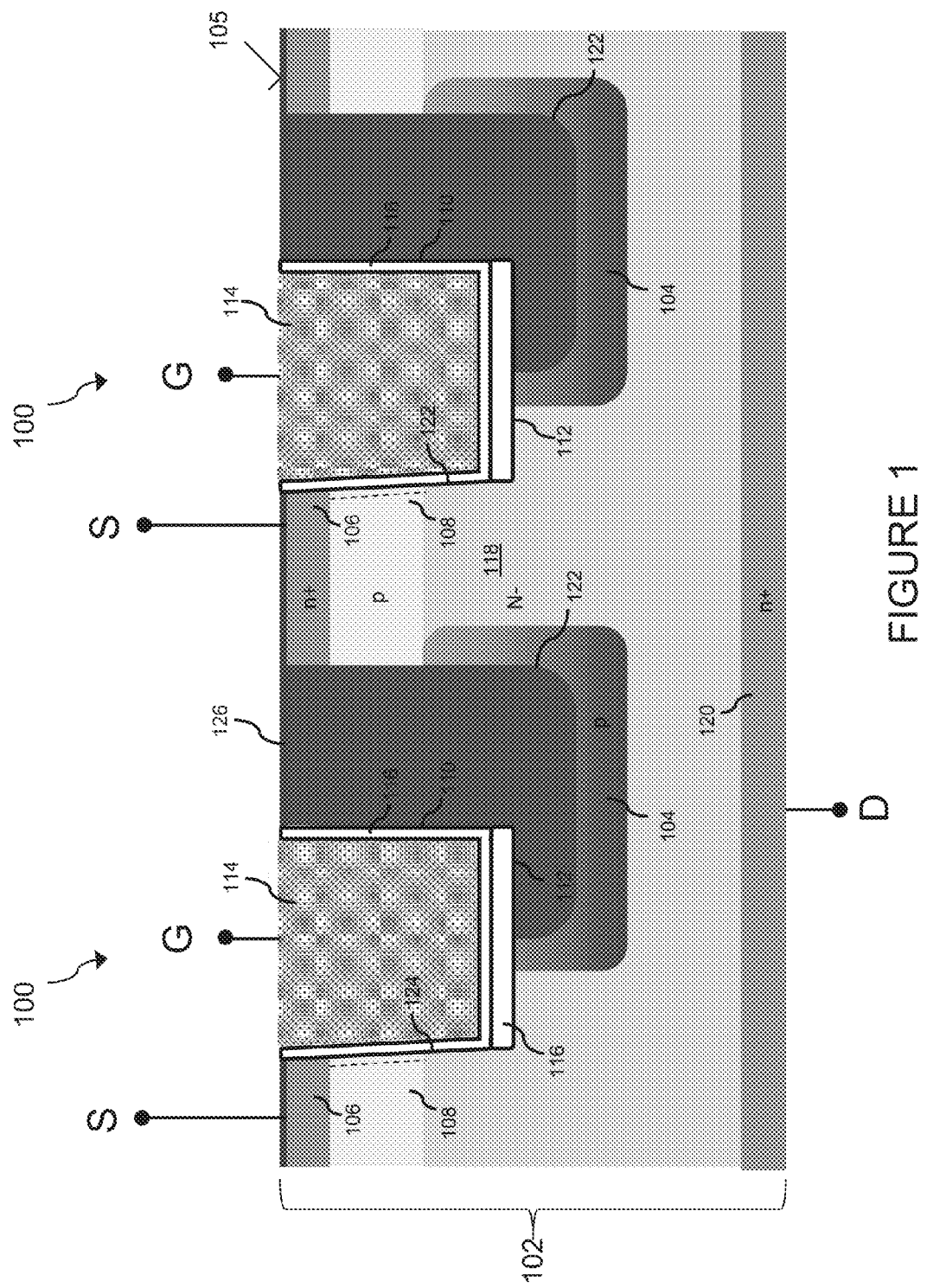
FIG. 1 illustrates a cross-sectional view of a vertical power transistor with a shielded gate electrode, according to an embodiment.

Embodiments disclosed herein provide a method of forming a semiconductor device from a silicon-carbide semiconductor substrate 102. An exemplary semiconductor device 100 that may be formed according to the methods described herein is depicted in FIG. 1. The device 100 includes a plurality of first doped regions 104 being laterally spaced apart from one another and beneath a main surface 105 of the substrate 102. A second doped region 106 extends from the main surface 105 to a third doped region 108 that is above the first doped regions 104. The second doped region 106 has a first conductivity type (e.g., n-type). The first and third doped regions 104, 108 have a second conductivity type (e.g., p-type). The device 100 further includes a gate trench 110 that extends through the second and third doped regions 106, 108 and has a bottom 112 that is arranged over a portion of one of the first doped regions 104. An electrically conductive gate electrode 114 is arranged in the gate trench 110 and is dielectrically insulated from the substrate 102 by a gate dielectric 116. A plurality of fourth doped regions 122 extending from the main surface 105 to the first doped regions 104. The fourth doped regions 122 have the second conductivity type, and may be doped highly (e.g., P++) relative to the other regions such that the fourth doped regions 122 are electrically conductive.

According to an embodiment, the device 100 of FIG. 1 is an n-channel (depletion mode) MOSFET, wherein the second doped region 106 is an n-type source region, and the third doped region 108 is a p-type body (channel) region. The substrate 102 is intrinsically doped with n-type dopants such that a portion 118 of the substrate that is beneath the body region 104 and adjacent to the first doped regions 104 forms an n-type drift region of the device 100. The drift region 118 is coupled (either directly or indirectly) to a more highly doped n-type drain region 120. The source and drain regions 106, 120 may be coupled to source and drain potentials, respectively, by external electrodes (not shown). The fourth doped regions 122 are configured as p-type electrically conductive contact regions. The contact regions 122 form an ohmic connection with the first doped regions 104 and therefore allow the first doped regions 104 to be connected to an external potential (e.g., source potential).

In a commonly known manner, the gate electrode 114 is configured to provide or remove an electrically conductive channel in the body region 108. A biasing of the gate electrode 114 relative to a source potential provides ON/OFF control of the device 100. The first doped regions 104 are configured as buried p-type regions that shield the gate dielectric 116 from the electric fields that develop in the substrate 102 during operation of the device 100. In the event that the device is in the OFF state and a large reverse voltage is applied to the source and drain terminals, is the large reverse voltage will be distributed across the drift region 118. The buried p-type regions 104 provide a space-charge region (i.e., a depletion region) with the surrounding n-type material. This space charge region provides a protective barrier that shields the gate dielectric 116 from the large electric field in the drift region 118. Thus, by providing the buried p-type regions 104 in the depicted manner, the advantageous breakdown characteristics of SiC material can be harnessed and the blocking capability of the gate dielectric 116 is less of a limiting factor in the overall reverse blocking capability of the device 100. In other words, the buried p-type regions 104 improve the breakdown characteristics of the device 100.

According to methods described herein, the gate trench 110 can be formed such that a first sidewall 124 that is adjacent to the channel of the device 100 aligns with a crystallographic plane of the substrate 102, such as the 11-20 crystallographic plane. In SiC material, the 11-20 crystallographic plane offers high electron mobility as compared to other crystallographic planes. Therefore, if the channel can be configured such that carriers travel along the 11-20, the performance of the device 100 can be improved.

Advantageously, the methods described herein utilize a two-step process to form the gate trenches 110 such that the first sidewall 124 is closely or exactly aligned with a desired crystallographic plane, such as the 11-20 crystallographic plane. In a first step, the gate trench 110 is formed by a masked-etching technique such that the first sidewall 124 is angled at approximately 86 degrees relative to the main surface 105 and is in approximate conformity with the 11-20 crystallographic plane. In a second step, the substrate 102 is placed at a high temperature (e.g., 1500 degrees centigrade) in a non-oxidizing and non-nitride forming atmosphere, such as Hydrogen ($H_2$) or Argon (Ar), so as to realign silicon-carbide atoms at the first sidewall 124. This brings the first sidewall 124 into closer conformity with the 11-20 crystallographic plane. However, this high temperature step modifies the SiC material in the vicinity of the first sidewall 124. The rearrangement of silicon-carbide atoms leads to a rearrangement of dopant atoms in a surface layer of the gate trench. The surface layer is a layer of SiC material that is 20-40 nm thick, for example, and extends to the surfaces of the gate trench 110, including the first sidewall 124. The high-temperature step may cause this surface layer to become completely undoped or at least to have a non-uniform and non-predictable doping concentration. Because the surface layer encompasses the channel region of the device 100, undesirable device characteristics such as increased leakage current and imprecise threshold voltage control may result from the rearrangement of dopant atoms associated with the high-temperature step.

Advantageously, the methods described herein include a process step to remove the surface layer that forms during the high-temperature process step that realigns silicon-carbide atoms at the first sidewall 124. According to an embodiment, the surface layer is removed by a sequence of oxidizing the substrate 102 so as to form a sacrificial oxide layer 126 and subsequent removal of the sacrificial oxide layer 126 from at least part of the gate trench trenches 110. Alternatively, techniques, such as wet-chemical etching may be utilized to remove the surface layer. As a result of removing the surface layer, the first sidewall 124 of the gate trench 110 can be formed to be in close or exact conformity with the 11-20 crystallographic plane without the disadvantages of increased leakage current and imprecise threshold voltage control.

A further advantage of the high-temperature step and subsequent removal of the surface layer that forms during the high-temperature step is that the robustness of the device 100 is improved, as it is less susceptible to acute failure (e.g., from leakage current) and long term failure (e.g., from dielectric breakdown). This is at least partly attributable to the fact that the gate trench 110 is formed with smooth surfaces and rounded transitions such that the gate dielectric 116 has a relatively uniform thickness and the fact that the interface between the gate dielectric 116 and the SiC material is essentially defect free.

According to an advantageous embodiment, the gate trench 110 is formed after the buried doped regions 104 are formed and after the source, body and contact regions 106, 108, 122 are formed. Forming these regions may require an annealing process to activate dopant atoms in the source, body and contact regions 106, 108, 122. Such an annealing process may require that the substrate is subjected to temperatures of between 1700 and 1800 degrees centigrade. By forming the gate trench 110 after this annealing process, the geometry of the gate trench 110, and in particular the alignment of the sidewalls with a particular crystallographic plane, is not influenced by the high temperatures required to activate the dopant atoms.

FIGS. 2-17 depict selected method steps that may be used to form the semiconductor device 100 of FIG. 1.

Figure 2:
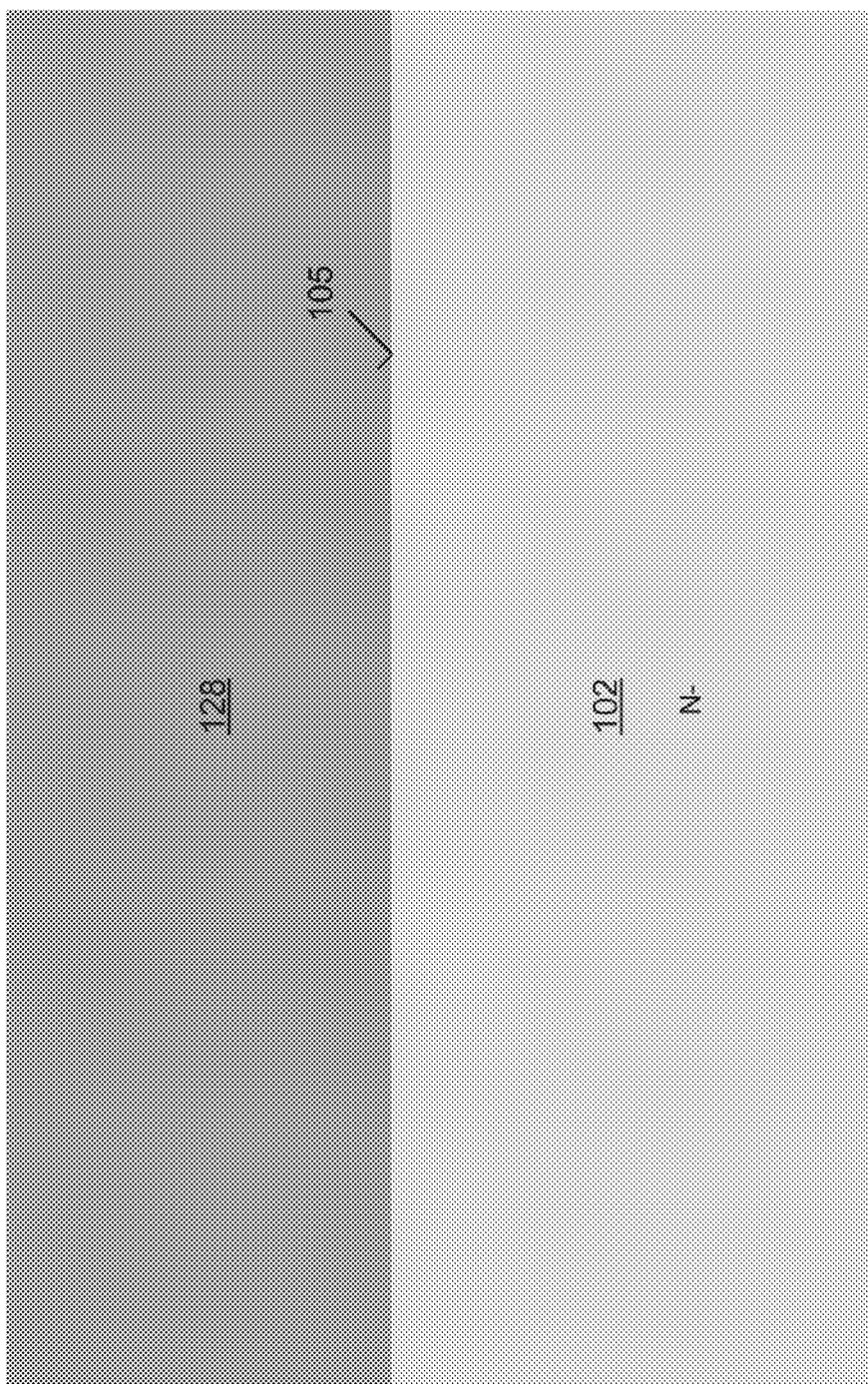
FIG. 2 illustrates a processing step of forming an oxide layer on a silicon-carbide substrate, according to an embodiment.

Referring to FIG. 2, a silicon-carbide (SiC) semiconductor substrate 102 is provided. The semiconductor substrate 102 may be formed by an epitaxial growth process. According to an embodiment, the semiconductor substrate 102 is doped with first conductivity type dopants (e.g., n-type dopants) during the epitaxial growth process such that the substrate 102 has an intrinsic first conductivity type majority carrier concentration.

A first dielectric layer 128 is formed along a main surface 105 of the substrate 102. The first dielectric layer 128 may be an oxide, such as $SiO_2$. According to an embodiment, the first dielectric layer 128 is formed by depositing $SiO_2$ on the main surface 105. The first dielectric layer 128 may have a thickness of between 2-4 µm, e.g., 3 µm.

Figure 3:
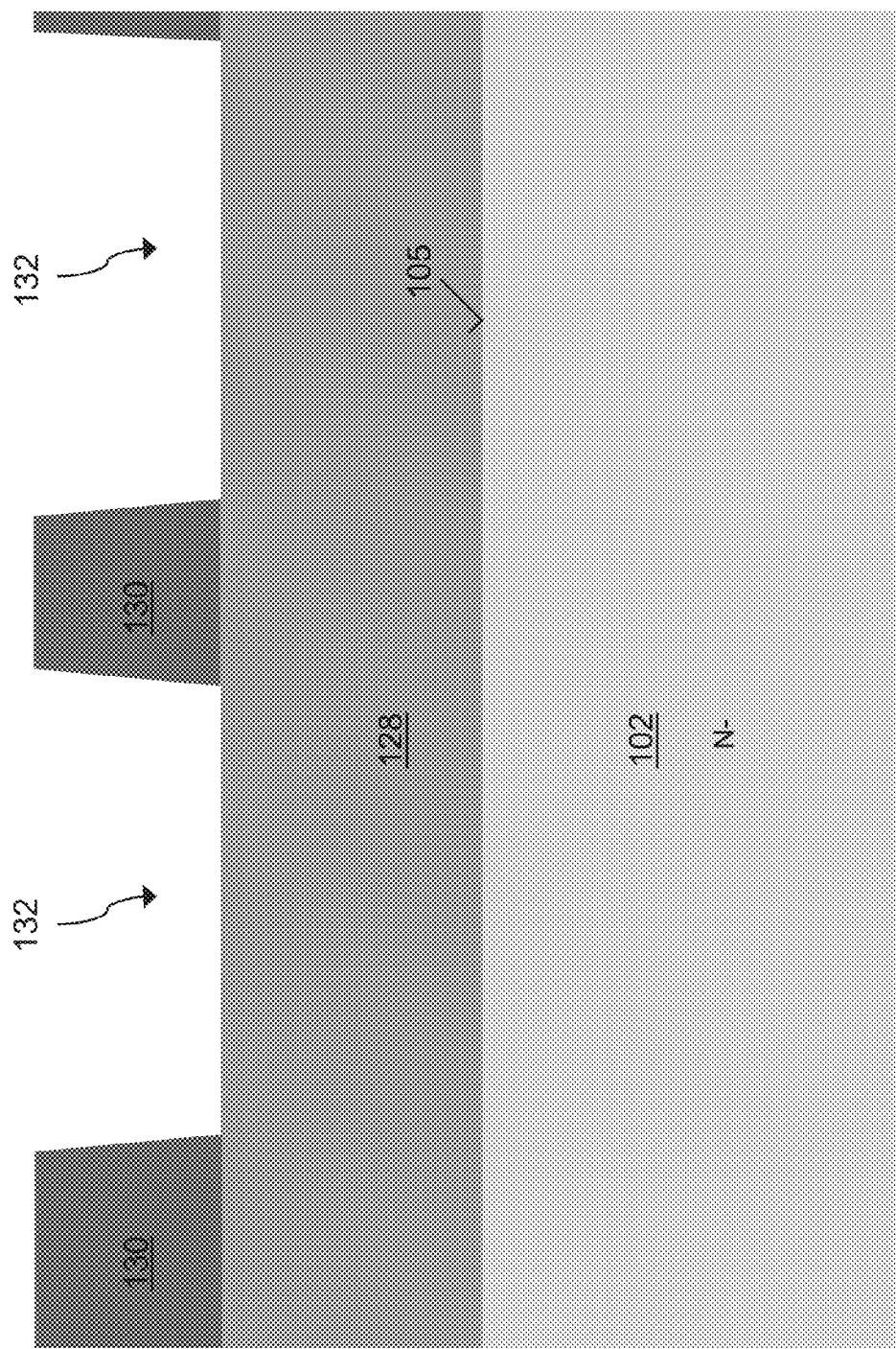
FIG. 3 illustrates a processing step of masking the oxide layer of FIG. 2, according to an embodiment.

Referring to FIG. 3, a first mask 130 is formed on the first dielectric layer 128. The first mask 130 may be a photoresist mask that is formed according to commonly known techniques. The first mask 130 is patterned so that portions of the first dielectric layer 128 are exposed by openings 132 in the first mask 130 and so that other portions of the first dielectric layer 128 are covered by the first mask 130.

Figure 4:
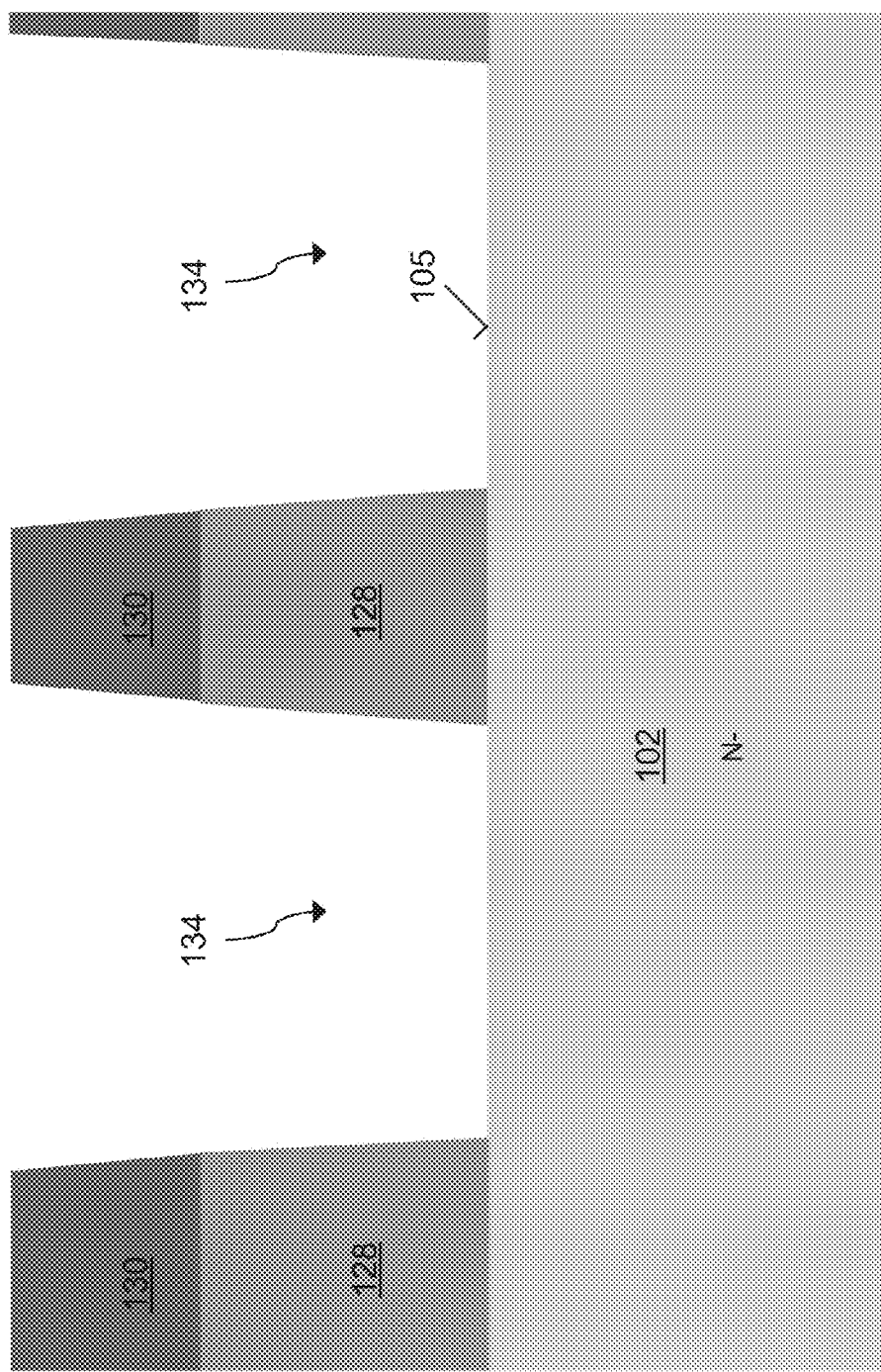
FIG. 4 illustrates a processing step of etching the oxide layer, according to an embodiment.

Referring to FIG. 4, the unmasked portions of the first dielectric layer 128 are removed. This may be done using wet or dry etching techniques. The etching is carried out such that the main surface 105 of the substrate 102 is exposed by openings 134 in the first dielectric layer 128.

Figure 5:
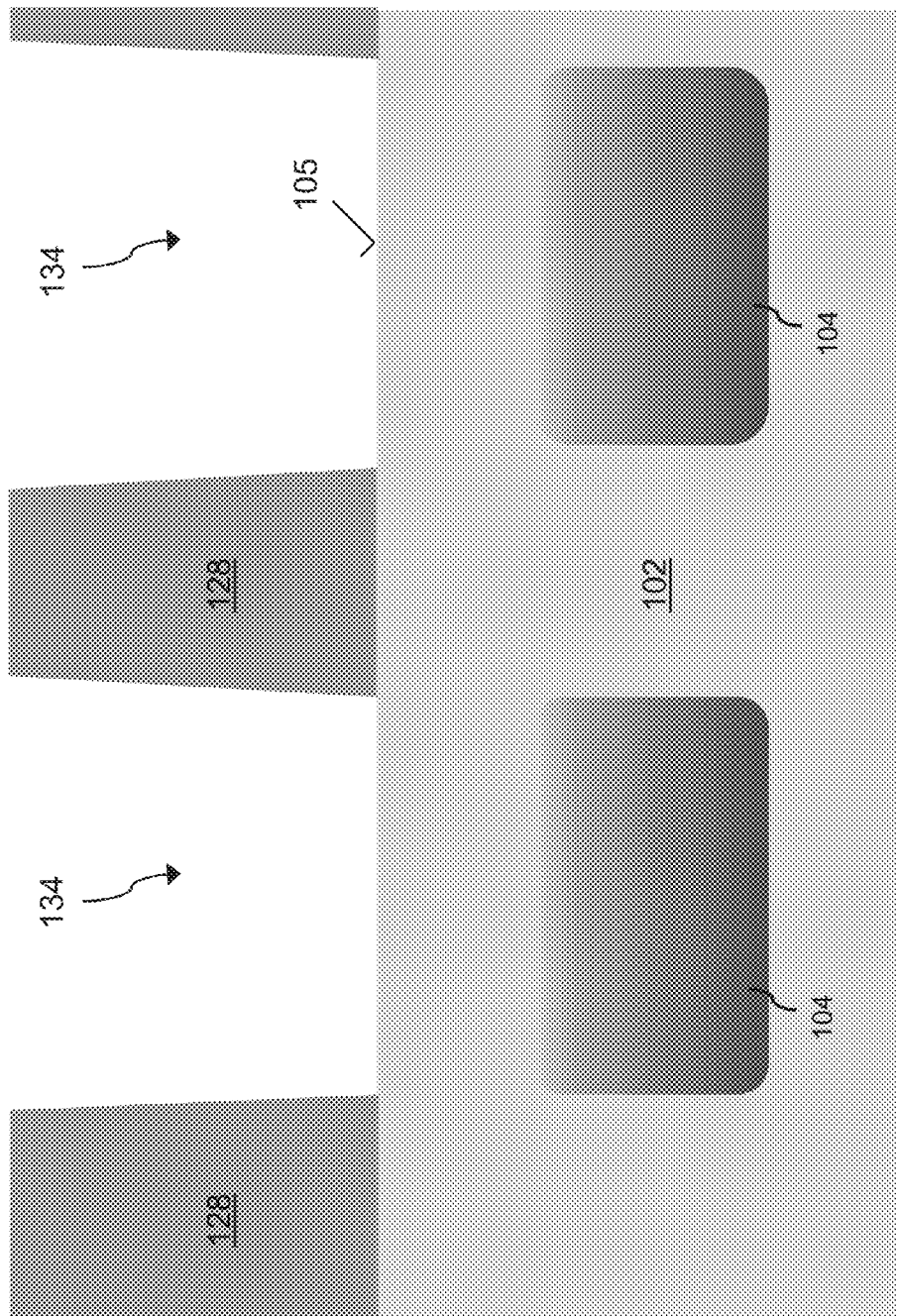
FIG. 5 illustrates a processing step of forming buried doped regions in the substrate using the oxide layer as an implantation mask, according to an embodiment.

Referring to FIG. 5, a plurality of first doped regions 104 is formed in the substrate 102. The first doped regions 104 are laterally spaced apart from one another and are arranged beneath the main surface 105 of the substrate 102. The first doped regions 104 are formed by implanting dopant atoms into the substrate 102. The dopant atoms have a second conductivity type that is opposite from the conductivity type of the substrate 102, i.e., the first conductivity type. The first dielectric layer 128 prohibits the dopant atoms from penetrating the portions of the substrate 102 that are covered by the first dielectric layer 128. That is, the first dielectric layer 128 is used as an implantation mask, wherein the openings 134 in the first dielectric layer 128 define the geometry of the first doped regions 104. According to an embodiment, the first doped region 104 is doped with a dopant concentration that increases with increasing distance from the main surface 105. That is, the doping concentration of the first doped region 104 is much higher at the bottom of the first doped region 104 than at the top of the first doped region 104. This profile prevents the dopants in the first doped region 104 from influencing the body region 108, which is formed immediately above the first doped region 104, and has the same conductivity type.

Figure 6:
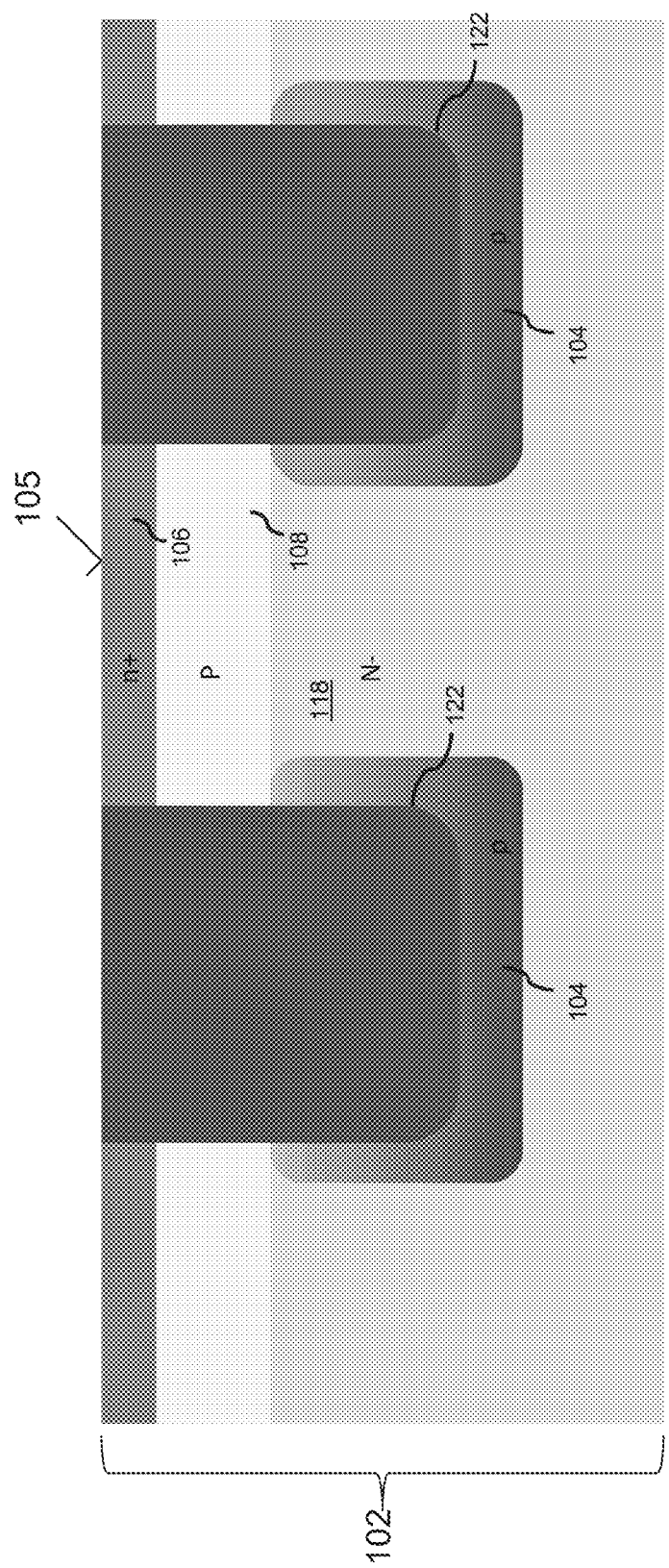
FIG. 6 illustrates further processing steps applied to the substrate to form device regions and an electrical connection to the buried doped regions, according to an embodiment.

Referring to FIG. 6, the first dielectric layer 128 has been removed and further processing steps have been applied to the substrate 102. These further processing steps include forming the second and third doped regions 106, 108 in the substrate 102 and forming a plurality of the fourth doped regions 122. Each of the second, third and fourth doped regions 106, 108, 122 may be formed by ion implantation. A doping concentration of the fourth doped regions 122 may be selected such these regions 122 are electrically conductive and form an ohmic connection with the first doped regions 104. For example, the fourth doped regions 122 may be P++ regions. After first and second conductivity type dopant atoms are implanted into the substrate 102 to form these regions, the substrate 102 may be annealed at a temperature of between 1700-1800 degrees centigrade, for example, to activate the dopant atoms.

Figure 7:
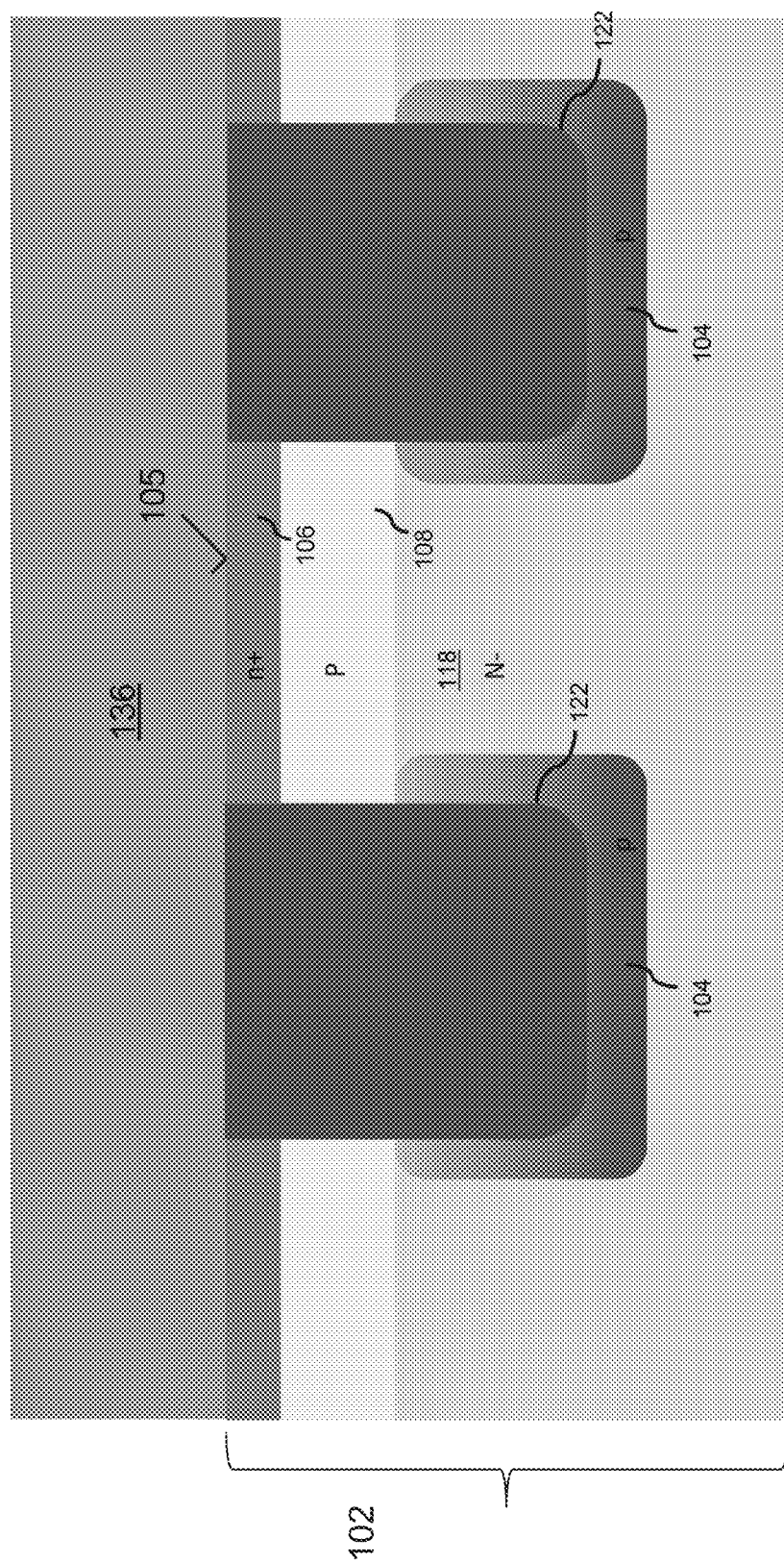
FIG. 7 illustrates a processing step of forming an oxide layer over the substrate of FIG. 6, according to an embodiment.

Referring to FIG. 7, a second dielectric layer 136 is formed along the main surface 105 of the substrate 102. According to an embodiment, the second dielectric layer 136 is formed by depositing $SiO_2$ on the main surface 105. The thickness of the second dielectric layer 136 may be selected so that a required depth of the gate trenches 110 can be achieved. For example, the dielectric layer 136 can be formed with a thickness of at least 1.5 µm to provide a gate trench 100 that is 1.0 µm deep. This provides a buffer thickness for the dielectric layer 136 in the case that the substrate 102 cannot be etched selective to the dielectric layer 136.

Figure 8:
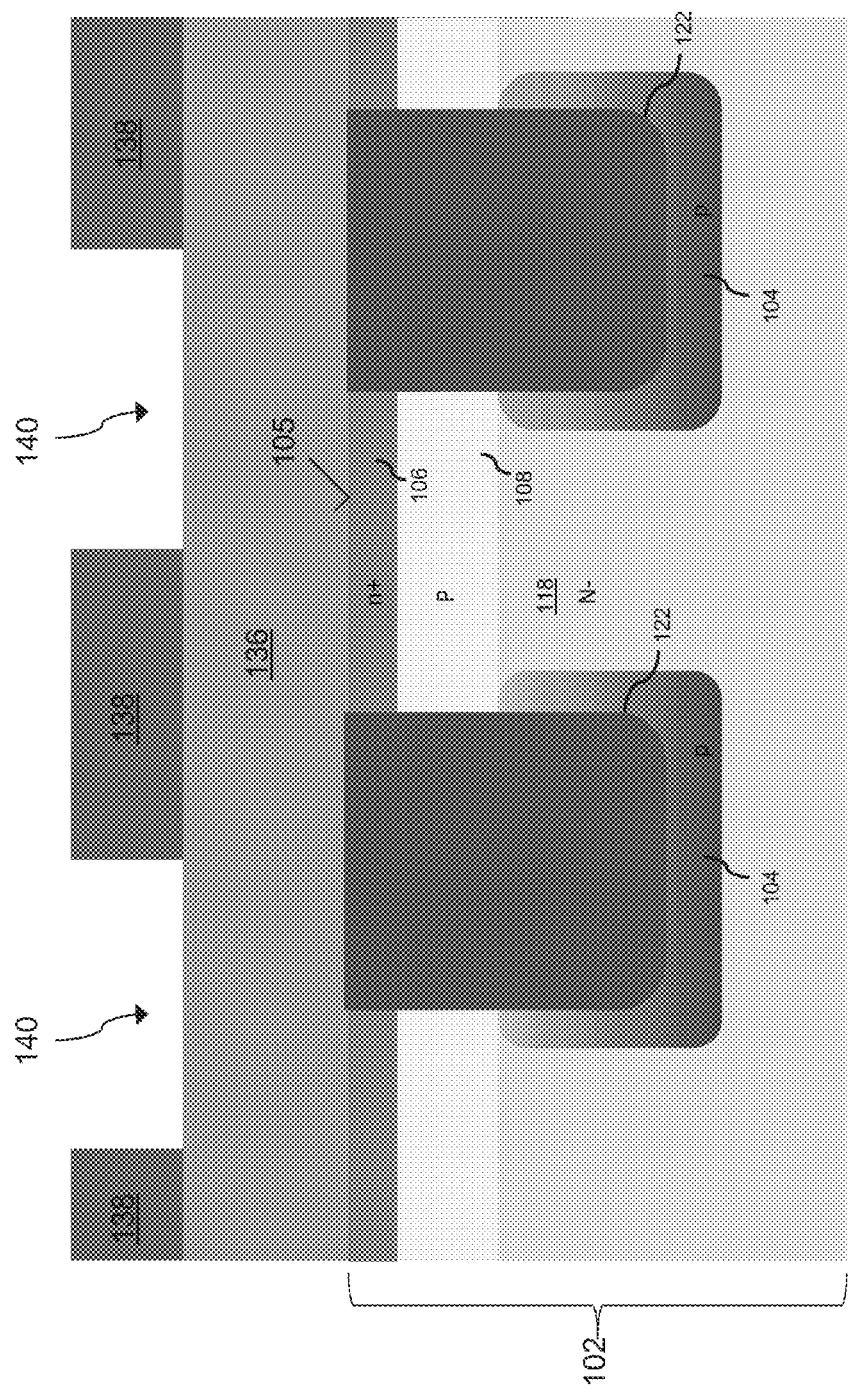
FIG. 8 illustrates a processing step of masking the oxide layer of FIG. 7, according to an embodiment.

Referring to FIG. 8, a second mask 138 is formed on the second dielectric layer 136. The second mask 138 may be a photoresist mask that is formed according to commonly known techniques. The second mask 138 is patterned so that portions of the second dielectric layer 136 are exposed by openings 140 in the second mask 138 and so that other portions of the second dielectric layer 136 are covered by the second mask 138.

Figure 9:
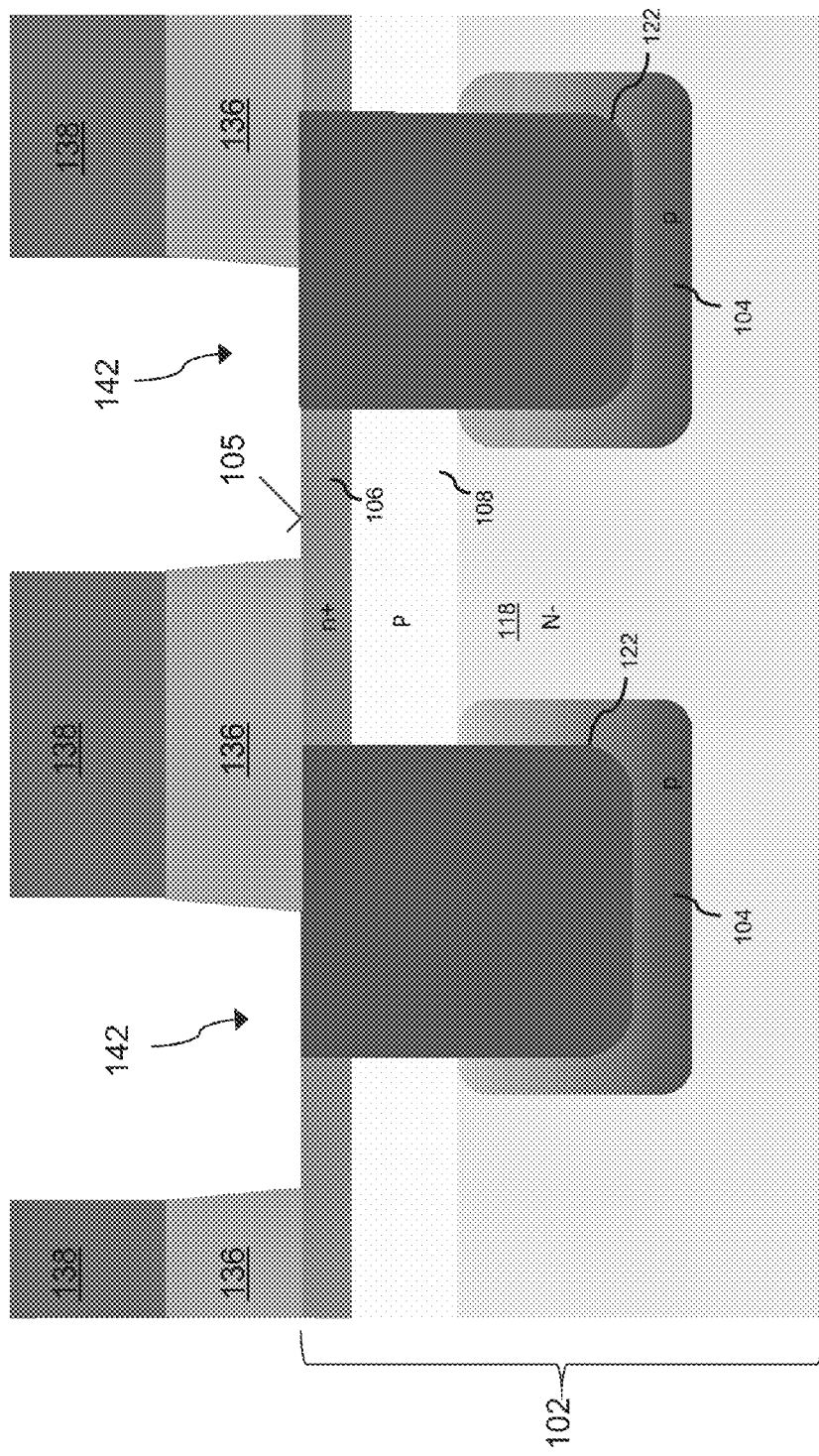
FIG. 9 illustrates a processing step of etching the oxide layer of FIG. 8, according to an embodiment.

Referring to FIG. 9, the unmasked portions of the second dielectric layer 136 are removed. This may be done using wet or dry etching techniques. The etching is carried out such that the main surface 105 of the substrate 102 is exposed by openings 142 in the second dielectric layer 136. According to an embodiment, the etching process is an anisotropic etching process in which sidewalls of the second dielectric layer 136 are substantially orthogonal to the main surface 105. This allows for a close correlation between the patterning of the second mask 138 and the geometry of the portions of the substrate 102 that are exposed by the openings 142.

Figure 10:
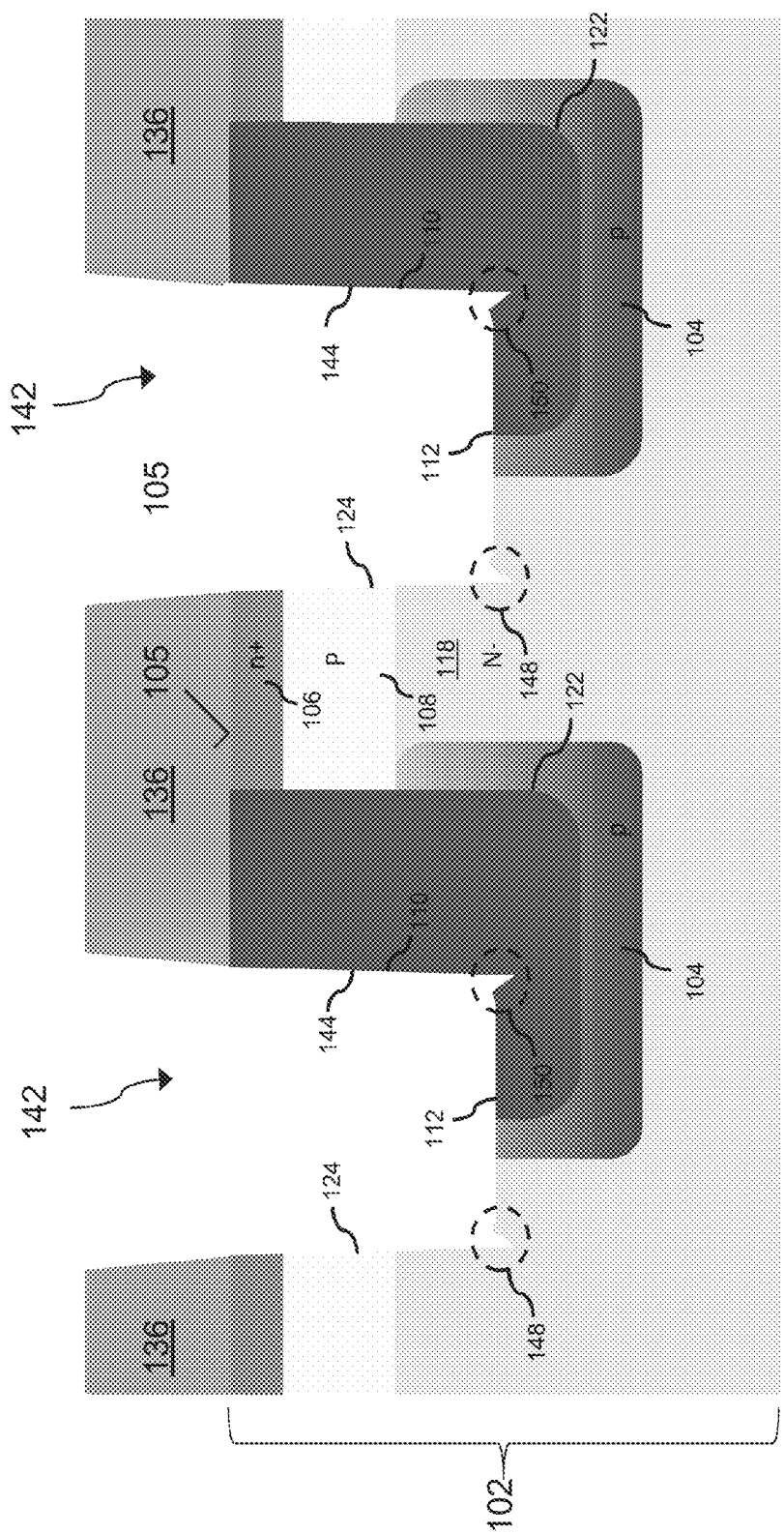
FIG. 10 illustrates a processing step of etching the substrate using the oxide layer of FIG. 9 as an etch mask to form gate trenches, according to an embodiment.

Referring to FIG. 10, the second mask 138 is removed and the exposed portions of the substrate 102 are etched away to form gate trenches 110 in the substrate 102. That is, the second dielectric layer 136 is used as an etch mask for the formation of the gate trenches 110. The gate trenches 110 are formed by etching away a portion of the substrate 102 that includes the second and third doped regions 106, 108. In addition, an upper portion of one of the first doped regions 104 may be removed during the etching of the gate trenches 110. According to an embodiment, the gate trenches 110 are formed by an anisotropic dry etching technique.

The gate trench 110 includes first and second sidewalls 124, 144 that extend through the second and third doped regions 106, 108 and a bottom 112 that is arranged over a portion of one of the first doped regions 104. The first sidewall 124 extends through the second and third doped regions 108 in a lateral section of the substrate 102 that is between adjacent ones of the first doped regions 104 to a first lower corner 148 that is between adjacent ones of the first doped regions 104. The second sidewall 144 extends through the second and third doped regions 106, 108 in a lateral section of the substrate 102 that overlaps with one of the first doped regions 104 to a second lower corner 150 that is arranged within one of the first doped regions 104. In other words, the gate trench 110 may be formed such that the bottom 112 extends through the n-type drift region 118 and one of the buried p-type buried regions 104. The bottom 112 may also extend through the contact region 122. Alternatively, the contact region 122 may be arranged beyond a lateral end of the gate trench 110 such that the contact region 122 only connects to the first doped region 104 in a lateral portion of the substrate 102 that does not intersect with the gate trench 110.

Figure 11:
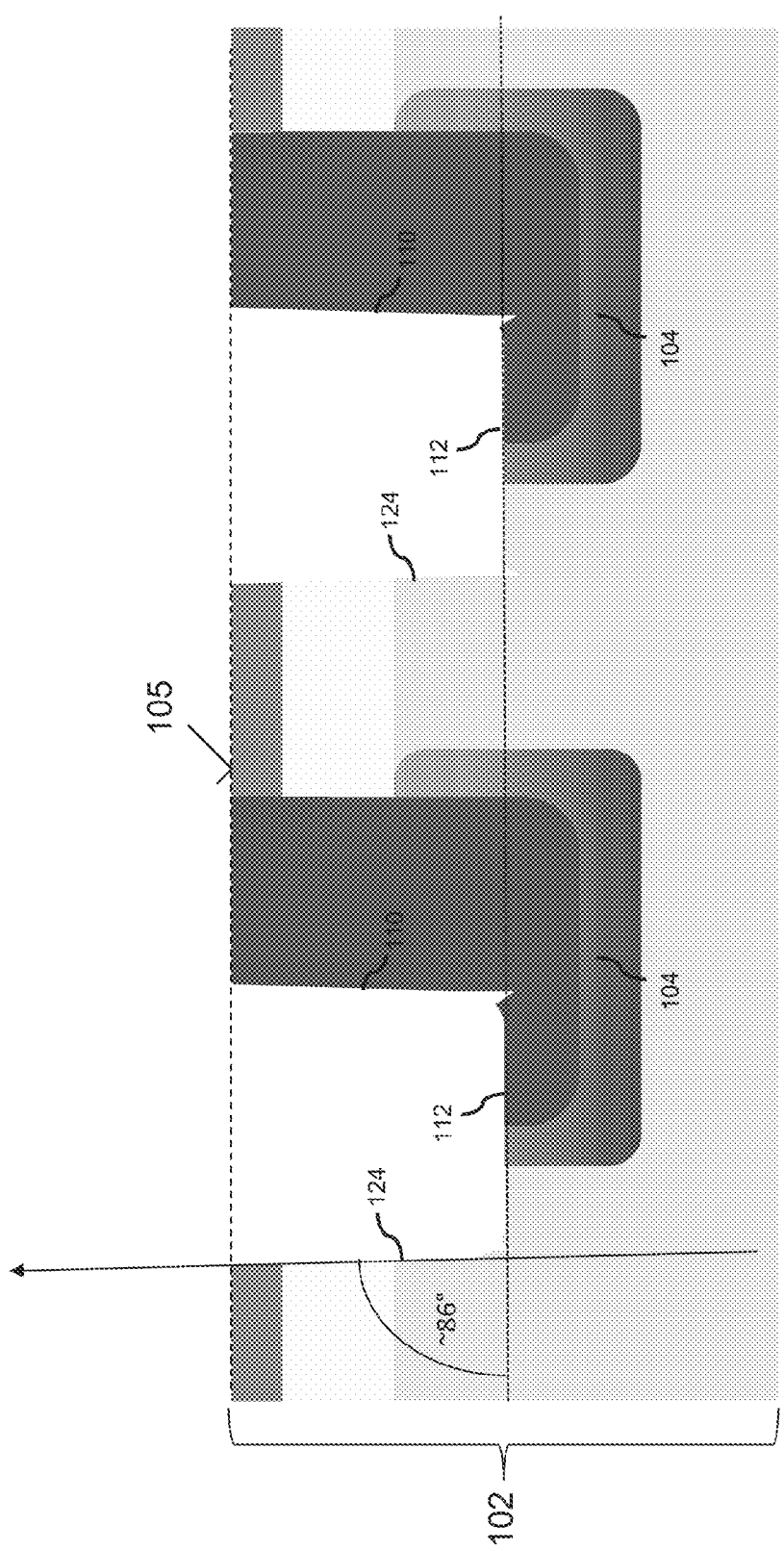
FIG. 11 illustrates a processing step of removing the oxide layer from the substrate, according to an embodiment.

According to an embodiment, the substrate 102 is etched such that, within process tolerances of the etching process, the first sidewall 124 of the gate trench 110 approximately aligns with a crystallographic plane of the substrate 102. For example, the substrate 102 may be etched such that the first sidewall 124 is angled at approximately 86 degrees relative to the main surface 105 and/or the bottom 112 of the gate trench 110. This orientation is shown in FIG. 11. In this embodiment, the first sidewall 124 is not perpendicular to the main surface 105 of the substrate 102 or to the bottom 112 of the gate trench 110 (in the event that the bottom 112 is perpendicular to the main surface 105) and instead is offset from a perpendicular plane by an angle of approximately 4 degrees. The 86 degree angle results in the first sidewall 124 being approximately aligned with the 11-20 crystallographic plane of the substrate 102. The 11-20 crystallographic plane offers enhanced electron mobility in comparison to other crystallographic planes, such as the 1-100 plane or the −1-120 plane, for example. Thus, by forming the gate trench 110 such that the first sidewall 124 is approximately aligned with the 11-20 crystallographic plane, the performance of the device (e.g., on-resistance) can be improved.

Due to the tolerances of the etching process, it is not possible to form the first sidewall 124 precisely at an 86 degree angle relative to the main surface 105 (and therefore precisely along the 11-20 crystallographic plane). Known etching techniques are only able to achieve a process window of +/−1 degrees. That is, within attainable process windows, the first sidewall 124 may be oriented anywhere from 85 to 87 degrees, relative to the main surface 105. Furthermore, the etching process is limited in its ability to optimize the geometry the first and second corners 148, 150. As shown in FIG. 10, there are abrupt angles at the first and second corners 148, 150 such that the surface of the gate trench 110 in the vicinity of the first and second corners 148, 150 is uneven. That is, the first and second sidewalls 124, 144 and the bottom 112 of the gate trench 110 deviate from their respective planes as they approach the first and second corners 148, 150. For example, FIG. 10 depicts two notch-shaped regions at the first and second corners 148, 150. This geometry is not conducive to the formation of a gate dielectric (e.g., $SiO_2$) in the gate trench 110. It may be difficult or impossible to form an oxide in the vicinity of the first and second corners 148, 150. Thus, the thickness of the gate dielectric 116 may be lower in the first and second corners 148, 150, which increases the likelihood of device failure (e.g., from leakage currents or dielectric breakdown). To summarize, the exclusive use of an etching technique to form the gate trench 110 without further measures results in a less than optimal geometry of the gate trench 110.

Figure 12:
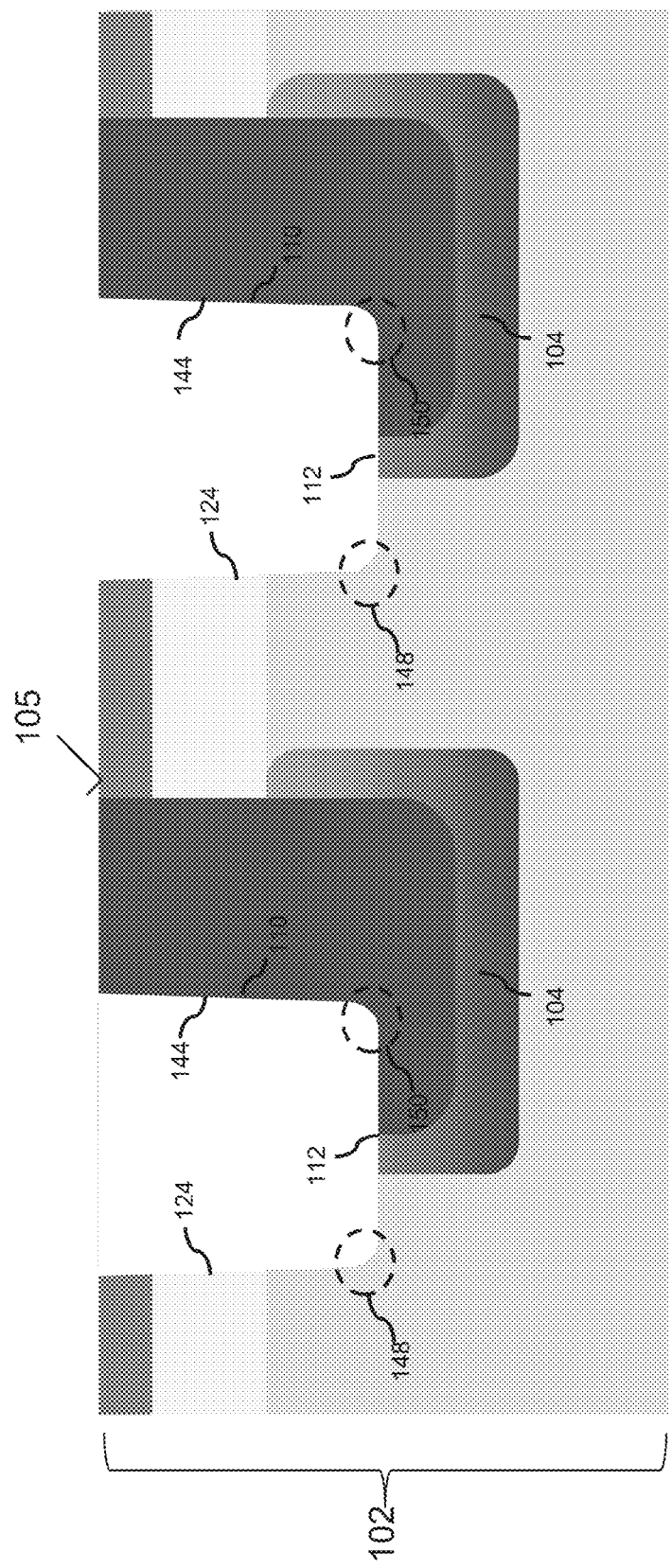
FIG. 12 illustrates a processing step of applying a high-temperature step in a non-oxide and non-nitride forming atmosphere so as to form rounded corners in the gate trenches, according to an embodiment.

Referring to FIG. 12, the substrate 102 has been placed in a non-oxide and non-nitride forming atmosphere at a high temperature so as to bring the first sidewall 124 into closer alignment with the 11-20 crystallographic plane. This can be achieved by setting the time, temperature and atmosphere of the high-temperature step. According to an embodiment, the substrate 102 is placed in a hydrogen ($H_2$) or argon (Ar) atmosphere at a temperature of between 1400 and 1600 degrees centigrade for a duration of approximately five to seven minutes. For example, the substrate 102 may be placed in a hydrogen ($H_2$) atmosphere at a temperature of 1500 degrees centigrade for a duration of six minutes.

The high temperature step of placing the substrate 102 in a non-oxide and non-nitride forming atmosphere in the manner described above induces a realignment of silicon-carbide atoms along the surfaces of the gate trench 110. The silicon-carbide atoms realign such that the first sidewall 124 uniformly extends along the 11-20 crystallographic plane. Furthermore, this realignment causes a rounding of the first and second corners 148, 150 such that the notch-shaped regions depicted in FIG. 10 are eliminated. In other words, there is a curved transition between the first and second sidewalls 124, 144 and the bottom 112 of the gate trench 110. The rounded first and second corners 148, 150 are more receptive to oxide deposition than the notch shapes depicted in FIG. 10 and therefore allow for the formation of a gate dielectric 116 with uniform thickness at the first and second corners 148, 150. Thus, the electric field peaks present in the gate dielectric 116 at the first and second corners 148, 150 can be reduced. To summarize, the high temperature step improves the process window of forming the first sidewall 124 precisely at an 86 degree angle relative to the main surface 105 (and therefore precisely along the 11-20 crystallographic plane) and additionally improves the geometry of the first and second corners 148, 150 for the formation of the gate dielectric 116.

Figure 13:
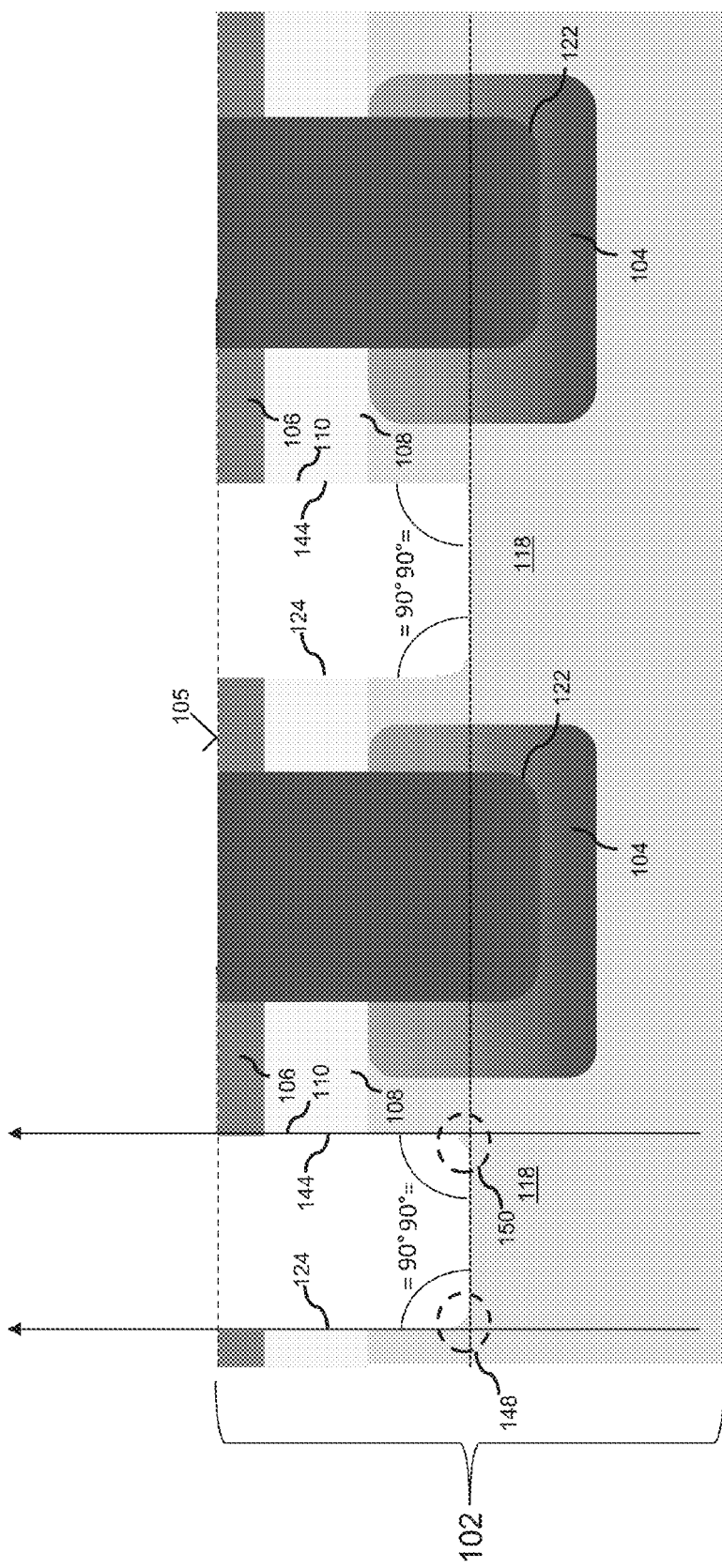
FIG. 13 illustrates an alternate configuration of the gate trenches, according to an embodiment.

FIG. 13 depicts an alternate embodiment in which the gate trench 110 is formed such that both of the first and second sidewalls 124, 144 extend through the second and third doped regions 106, 108 in a lateral section of the substrate 102 that is between adjacent ones of the first doped regions 104. That is, in comparison to the gate trench 110 of FIGS. 9-12, the gate trench 110 of FIG. 13 is laterally shifted so that the first and second sidewalls 124, 144 each extend into the n-type drift region 118 and are spaced apart from the buried doped regions 104. Thus, the entire gate trench 110 is formed in a lateral section of the substrate 102 that is between adjacent ones of the buried doped regions 104.

The gate trench 110 configuration of FIG. 13 allows for the formation of a channel of the device 100 along both the first and second sidewalls 124, 144. In this embodiment, the first and second sidewalls 124, 144 must be formed along a crystallographic plane other than the 11-20 crystallographic plane. More particularly, the gate trench 110 can be formed such that the first sidewall 124 aligns with the 1-100 crystallographic plane of the substrate 102 and the second sidewall 144 aligns with the -1100 crystallographic plane of the substrate 102. This is achieved by etching the substrate 102 in the manner described above such that both the first and second sidewalls 124, 144 are at approximately 90 degree angles (i.e., perpendicular) relative to the main surface 105. This etching technique is limited in the same manner as previously described in that an exact 90 degree angle is not achievable and may vary by +/-1 degrees. Subsequently, a high-temperature process in which the substrate 102 is placed in a non-oxide and non-nitride forming atmosphere in the manner described above (e.g., by placing the substrate 102 in a hydrogen (H2) atmosphere at a temperature of 1500 degrees centigrade for a duration of six minutes). This high-temperature step brings the first and second sidewalls 124, 144 into close or exact alignment with the 1-100 and the -1100 crystallographic planes, respectively. Furthermore, this high-temperature step produces the rounded first and second corners 148, 150 as previously discussed.

Figure 14:
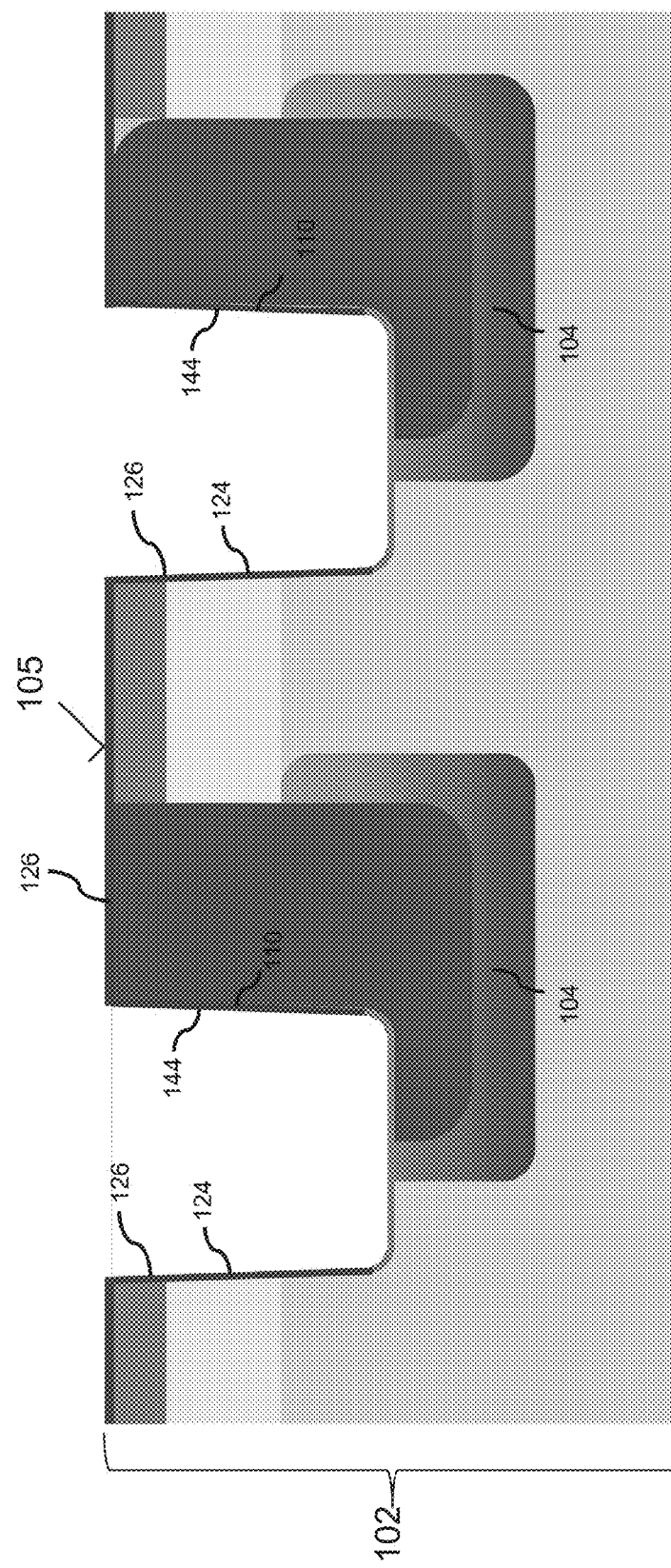
FIG. 14 illustrates a processing step of forming a sacrificial oxide in the gate trenches, according to an embodiment.

Referring to FIG. 14, after the formation of the gate trench 110 and the high-temperature step, the substrate 102 is oxidized, e.g., by thermal oxidation. This produces a sacrificial oxide layer 126. The sacrificial oxide layer 126 is formed at least in a portion of the gate trench 110. According to an embodiment, the entire substrate 102 is thermally oxidized such that the sacrificial oxide layer 126 forms along the main surface 105 and in the entire gate trench 110. The sacrificial oxide layer 126 is sufficiently thick (e.g., at least 30 nm thick) to encompass the surface layer that forms during the high-temperature step. Thus, the sacrificial oxide layer 126 can be used to remove the surface layer that forms in the gate trench 110 during the high-temperature step.

Figure 15:
FIG. 15 illustrates a processing step of masking the substrate to selectively remove portions of the sacrificial oxide, according to an embodiment.
Figure 16:
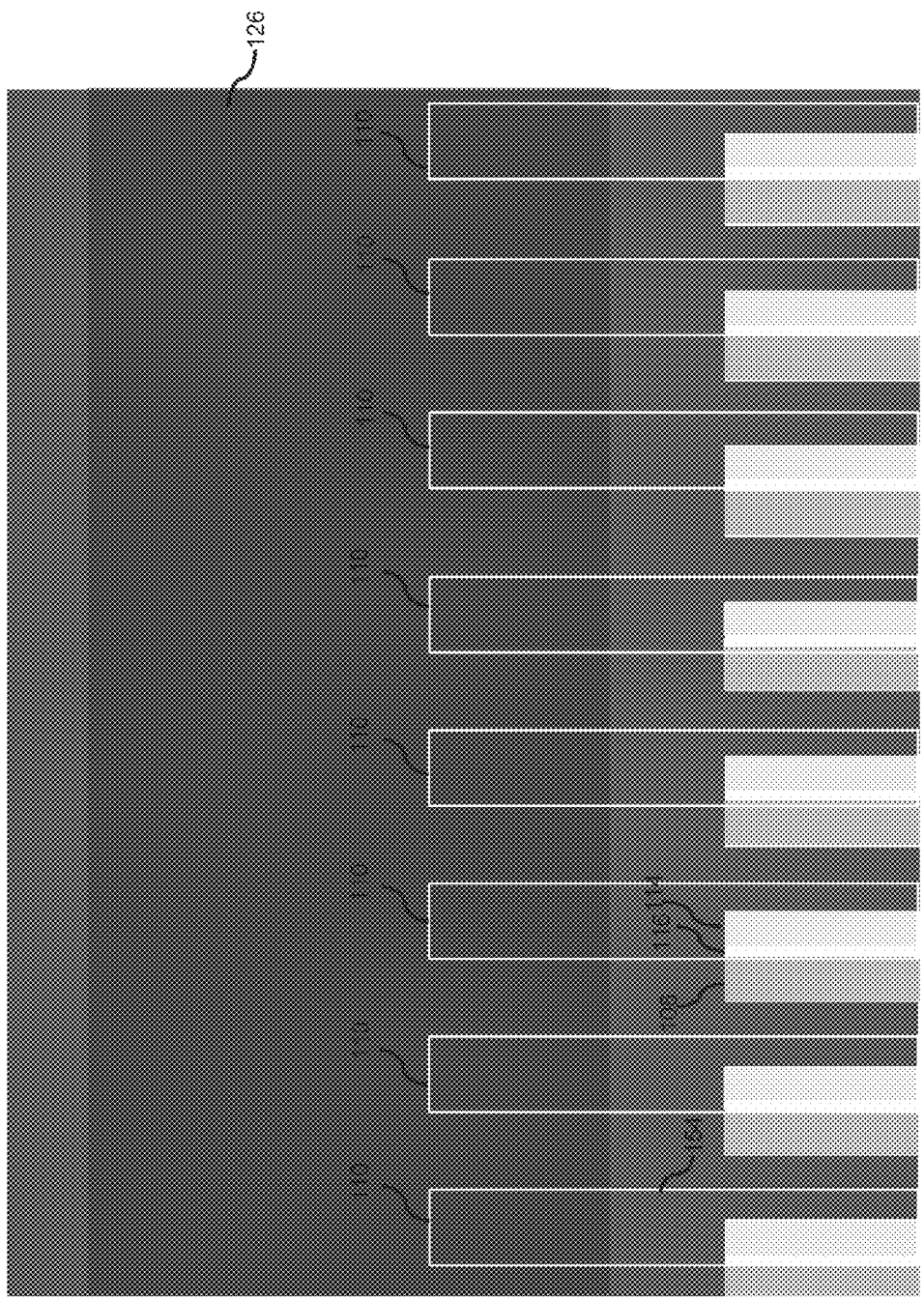
FIG. 16 illustrates the substrate after the removal of portions of the sacrificial oxide, according to an embodiment.

FIGS. 15-16 depict further processing steps from a plan-view perspective of the substrate 102 that may be applied to remove the sacrificial oxide layer 126 from least a portion of the gate trench 110. FIG. 15 depicts a plan-view of the substrate 102 with a plurality of the gate trenches 110 arranged in a cell field. The cell field is spaced apart from an edge of the substrate 102. As shown in FIG. 15, a mask 152 is provided over a portion of the substrate that overlaps with the cell field. The mask 152 may be any conventionally known photolithography mask, for example. According to an embodiment, the mask 152 is formed on the substrate 102 such that it covers lateral ends of the gate trench 110 and exposes a central section 154 of the gate trench 110 between the lateral ends.

Referring to FIG. 16, the sacrificial oxide layer 126 is removed from the unmasked portions of the substrate 102 and the mask 152 is subsequently removed. The sacrificial oxide layer 126 may be removed by a wet chemical etch technique, for example.

Due to the mask configuration of FIG. 15 in which the lateral ends of the gate trench are covered by the mask 152, the sacrificial oxide 126 is only etched from the central section 154 of the gate trenches 110. The lateral ends of the gate trenches 110 (i.e., the two ends of the gate trench 110 that are opposite from one another and outside of the central section 154) remain lined by the sacrificial oxide layer 126 after the etching process. By leaving the sacrificial oxide layer 126 at the lateral ends of the gate trenches 110, the reliability and robustness of the device 100 is improved. This is because it is difficult or impossible to form the gate dielectric 116 with a uniform thickness at the lateral ends of the gate trenches 110. As a result, field peaks occur in the gate dielectric 116 at the lateral ends of the gate trenches 110, which in turn make the device more susceptible to leakage and/or breakdown. By leaving the sacrificial oxide layer 126 at the lateral ends of the gate trenches 110, the thickness of dielectric material is increased such that the device can withstand larger electric fields. Furthermore, the inclusion of the sacrificial oxide layer 126 in the device 100 does not substantially degrade the switching performance device 100, as it is not present along most of the channel region of the device 100.

According to another embodiment, the sacrificial oxide layer 126 is completely removed from the gate trenches 110. In this embodiment, the mask 152 does not cover any part of the lateral ends of the gate trenches 110 such that, when the etching process is performed, the entire sacrificial oxide layer 126 is etched away.

Figure 17:
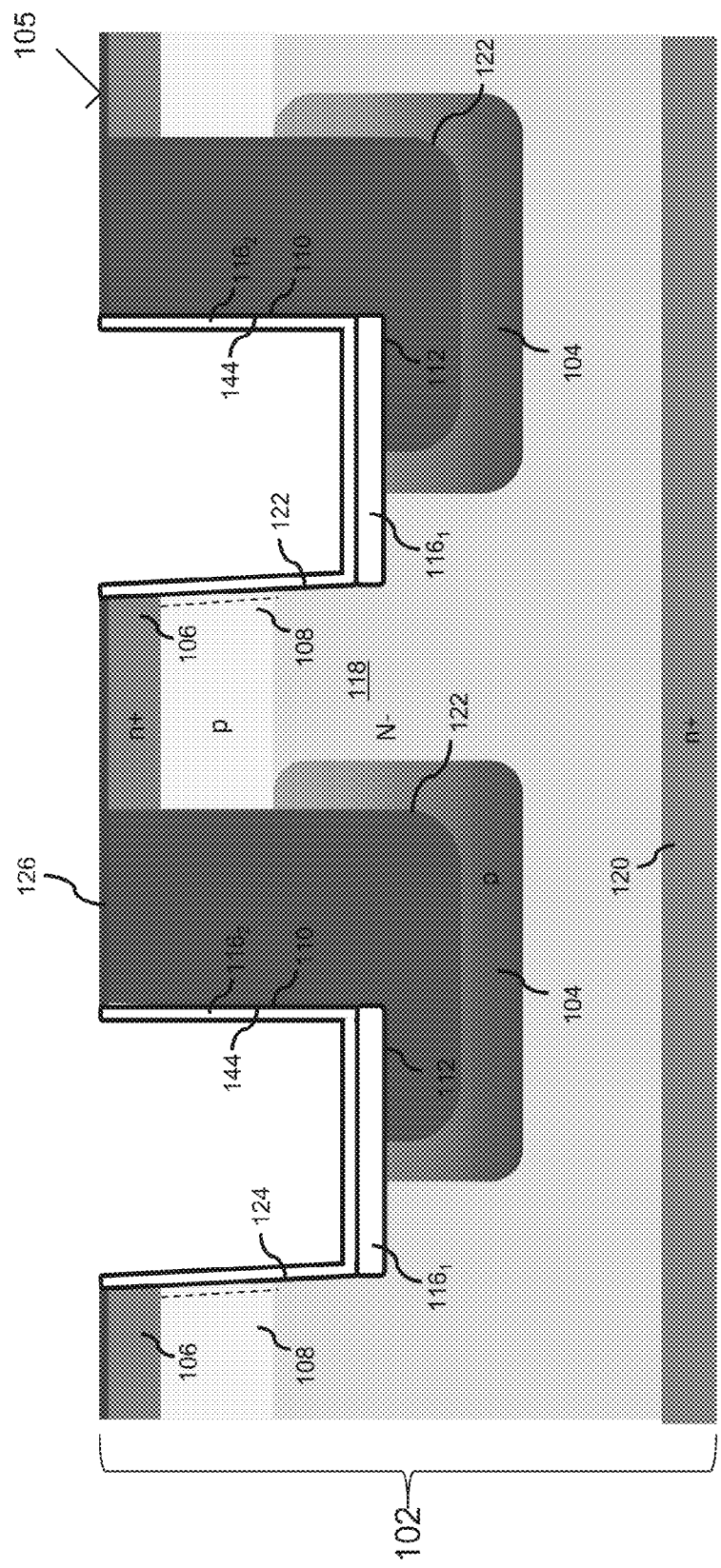
FIG. 17 illustrates further processing steps applied to the substrate so as to form a gate dielectric in the gate trenches such that an overall thickness of dielectric material in the gate trench is greater at the bottom of the gate trench than along the sidewalls, according to an embodiment.

Referring to FIG. 17, a gate dielectric 116 is formed in the gate trench 110. According to an embodiment, the gate dielectric 116 is formed by depositing a layer of silicon dioxide ($SiO_2$). A deposition technique may be preferable to other techniques, such as thermal oxidation, which may have different oxide growth rates along different crystallographic planes (e.g., as between a crystallographic plane of the bottom of the gate trench 110 and a crystallographic plane of the first and second sidewalls 124, 144). The gate dielectric 116 may be deposited throughout the gate trench 110 after etching the sacrificial oxide layer 126 only away from the central section 154 in the manner described above. As a result, the gate dielectric 116 directly adjoins the bottom 112 and sidewalls 124, 144 of the gate trench 110 in the central section and the sacrificial oxide layer 126 is interposed between the bottom 112 and sidewalls 124, 144 and the gate dielectric 126 at the lateral ends of the gate trench 110.

According to an embodiment, the gate dielectric 116 includes two layers $116_1$ and $116_2$. A first one of the dielectric layers $116_1$ is formed only along the bottom 112 of the gate trench 110 and not the sidewalls 124, 144. This configuration may be achieved using a high-density plasma deposition (HPD) process in which oxide is first deposited throughout the gate trench 110 and subsequently removed from the sidewalls 124, 144 of the gate trench 110. Subsequently, a second one of the dielectric layers $116_2$ is deposited in the gate trench 110 over the first dielectric layer $116_1$ and along the sidewalls 124, 144. By forming the gate dielectric 116 with the two layers $116_1$ and $116_2$ in the manner described above, an overall thickness of dielectric material in the gate trench 110 is greater at the bottom 112 of the gate trench 110 than along the sidewalls 124, 144. Consequently, the gradient of the electric field in the portion of the gate trench 110 that is exposed to the high electric fields of the SiC material can be reduced.

Subsequently, the substrate 102 depicted in FIG. 17 may be annealed in a gas atmosphere so as to passivate an interface between the gate dielectric 116 and the silicon-carbide semiconductor substrate 102. For example, the substrate 102 may be placed in a Nitric Oxide (NO) atmosphere at a temperature of between [1100-1250 degrees centigrade] for a duration of five minutes to six hours.

The gate electrode 114 may be formed in the gate trench 116 in a conventionally known manner.

In this specification, n-doped is referred to as first conductivity type while p-doped is referred to as second conductivity type. Alternatively, the semiconductor device 100 can be formed with opposite doping relations so that the first conductivity type can be p-doped and the second conductivity type can be n-doped. Furthermore, some figures illustrate relative doping concentrations by indicating "−" or "+" next to the conductivity type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to semiconductor devices, in particular to field effect semiconductor transistor and manufacturing methods therefor. Within this specification the terms "semiconductor device" and "semiconductor component" are used synonymously. The formed semiconductor device may be a vertical semiconductor device such as a vertical MOSFET with a source metallization arranged on the first surface, an insulated gate electrode arranged in a vertical trench next to the first surface and a drain metallization arranged on a second surface which is opposite to the first surface. The formed semiconductor device may be a power semiconductor device having an active area with a plurality of MOSFET-cells for carrying and/or controlling a load current. Furthermore, the power semiconductor device may have typically a peripheral area with at least one edge-termination structure at least partially surrounding the active area when seen from above.

Spatially relative terms such as "under," "below," "lower," "over," "upper" and the like, are used for ease of description to explain the positioning of one element relative to a second element. These terms are intended to encompass different orientations of the device 100 in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising:
   forming a silicon-carbide semiconductor substrate having a plurality of first doped regions being laterally spaced apart from one another and beneath a main surface of the substrate, a second doped region extending from the main surface to a third doped region that is above the first doped regions, and a plurality of fourth doped regions in the substrate extending from the main surface to the first doped regions, the second doped regions having a first conductivity type, the first, third and fourth doped regions having a second conductivity type;
   annealing the substrate so as to activate dopant atoms in the second, third and fourth doped regions;
   forming a gate trench that extends through the second and third doped regions and has a bottom that is arranged over a portion of one of the first doped regions;
   applying a high-temperature step in a non-oxide and non-nitride forming atmosphere so as to realign silicon-carbide atoms along sidewalls of the gate trench and to form rounded corners between the bottom and sidewalls of the gate trench; and
   removing a surface layer that forms along the sidewalls of the gate trench during the high-temperature step from the substrate.

2. The method of claim 1, wherein removing the surface layer comprises:
   oxidizing the surface layer to form a sacrificial oxide layer in the gate trench; and
   removing the sacrificial oxide layer from at least a portion of the gate trench.

3. The method of claim 2, wherein oxidizing the surface layer comprises lining the entire gate trench with the sacrificial oxide layer, and wherein removing the sacrificial oxide layer comprises removing the sacrificial oxide layer only from a central section of the gate trench such that lateral ends of the gate trench are lined by the sacrificial oxide layer after the removing of the sacrificial oxide layer.

4. The method of claim 3, wherein removing the sacrificial oxide layer only from the central section comprises:
   forming a mask on the substrate that covers the lateral ends of the gate trench and exposes the central section; and
   etching the sacrificial oxide away from the central section.

5. The method of claim 3, further comprising:
   depositing a gate dielectric throughout the gate trench after removing the sacrificial oxide layer such that the gate dielectric directly adjoins the bottom and sidewalls of the gate trench in the central section and such that the sacrificial oxide layer is interposed between the bottom and sidewalls and the gate dielectric at the lateral ends of the gate trench; and
   annealing the substrate in a gas atmosphere so as to passivate an interface between the gate dielectric and the silicon-carbide semiconductor substrate.

6. The method of claim 5, wherein depositing the gate dielectric comprises:
   forming a first dielectric layer only along the bottom of the gate trench; and forming a second dielectric layer over the first dielectric layer and along the sidewalls such that an overall thickness of dielectric material in the gate trench is greater at the bottom of the gate trench than along the sidewalls.

7. The method of claim 2, wherein oxidizing the surface layer comprises lining the entire gate trench with the sacrificial oxide layer, and wherein removing the sacrificial oxide layer comprises completely removing the sacrificial oxide layer from the gate trench.

8. The method of claim 1, wherein the first doped regions are formed by implanting dopant atoms into the substrate, and wherein the gate trench is formed after the implanting of the dopant atoms.

9. The method of claim 8, wherein forming the first doped regions comprises forming a first mask on the substrate, and wherein forming the gate trench comprises forming a second mask on the substrate after removing the first mask and etching away a portion of the substrate that includes the second and third doped regions.

10. The method of claim 9, wherein the substrate is etched such that, within process tolerances of the etching process, a first sidewall of the gate trench approximately aligns with a crystallographic plane of the substrate, and wherein the time, temperature and atmosphere of the high-temperature step are controlled such that the first sidewall is brought into closer alignment with the crystallographic plane.

11. The method of claim 10, wherein the substrate is etched such that the first sidewall is angled at approximately 86 degrees relative to the main surface so as to approximately align with a 11-20 crystallographic plane of the substrate, and wherein the high-temperature step comprises placing the substrate in a Hydrogen or Argon atmosphere at a temperature of between 1400 and 1600 degrees centigrade for a duration of approximately five to seven minutes to bring the first sidewall in closer alignment with the 11-20 crystallographic plane.

12. The method of claim 11, wherein the gate trench is formed such that the first sidewall extends to a first lower corner that is between adjacent ones of the first doped regions and such that the second sidewall extends to a second lower corner that is arranged within one of the first doped regions.

13. The method of claim 10, wherein the substrate is etched such that the first sidewall of the gate trench approximately aligns with the 1-100 crystallographic plane of the substrate and the second sidewall approximately aligns with the −1100 crystallographic plane of the substrate, and wherein the time, temperature and atmosphere of the high-temperature step are controlled such that the first sidewall and second sidewalls are brought into closer alignment with the 1-100 and −1100 crystallographic planes, respectively.

14. The method of claim 13, wherein the entire gate trench is formed in a lateral section of the substrate that is between adjacent ones of the first doped regions such that both the first and second sidewalls are spaced apart from the first doped regions.

15. The method of claim 1, wherein the gate trench is formed after the annealing of the substrate so as to activate dopant atoms in the second, third and fourth doped regions.

16. A method of forming a semiconductor device from a first conductivity type silicon-carbide semiconductor substrate having a main surface, the method comprising:
    forming a plurality of buried second conductivity type regions beneath the main surface and laterally spaced apart from one another;
    forming a first conductivity type source region and a second conductivity type body region in the substrate, the source region extending from the main surface to the body region, the body region being arranged above the buried regions;
    forming second conductivity type contact regions in the substrate extending from the main surface to the buried second conductivity type regions;
    annealing the substrate so as to activate dopant atoms in the source, body and contact regions;
    forming a gate trench that extends through the source and body regions and has a bottom that is arranged over a portion of the buried regions;
    applying a high-temperature step in a non-oxide and non-nitride forming atmosphere so as to realign silicon-carbide atoms along sidewalls of the gate trench and to form rounded corners between the bottom and sidewalls of the gate trench; and
    removing a surface layer that forms along the sidewalls of the gate trench during the high-temperature step from the substrate.

17. The method of claim 16, wherein removing the surface layer comprises:
    oxidizing the surface layer to form a sacrificial oxide layer in the gate trench; and
    removing the sacrificial oxide layer from at least a portion of the gate trench.

18. The method of claim 16, wherein the gate trench is formed after the annealing of the substrate so as to activate dopant atoms in the in the source, body and contact regions.

* * * * *

UNITED STATES PATENT AND TRADEMARK OFFICE
CERTIFICATE OF CORRECTION

PATENT NO. : 9,577,073 B2
APPLICATION NO. : 14/567504
DATED : February 21, 2017
INVENTOR(S) : R. Esteve et al.

It is certified that error appears in the above-identified patent and that said Letters Patent is hereby corrected as shown below:

In the Claims

Column 14, Line 47 (Claim 18, Line 3), please change "in the in the" to -- in the --

Signed and Sealed this
Sixth Day of June, 2017

Michelle K. Lee
*Director of the United States Patent and Trademark Office*